(12) United States Patent
Pethe et al.

(10) Patent No.: US 9,252,300 B2
(45) Date of Patent: Feb. 2, 2016

(54) METHOD FOR BACKSIDE-CONTACTING A SILICON SOLAR CELL, SILICON SOLAR CELL AND SILICON SOLAR MODULE

(75) Inventors: Wieland Pethe, Dresden (DE); Harald Hahn, Dresden (DE); Kristian Schlegel, Zwickau (DE); Torsten Weber, Dresden (DE); Martin Kutzer, Penig (DE)

(73) Assignee: SolarWorld Innovations GmbH, Freiberg (DE)

( * ) Notice: Subject to any disclaimer, the term of this patent is extended or adjusted under 35 U.S.C. 154(b) by 635 days.

(21) Appl. No.: 13/464,365

(22) Filed: May 4, 2012

(65) Prior Publication Data

US 2012/0279547 A1 Nov. 8, 2012

(30) Foreign Application Priority Data

May 5, 2011 (DE) .................. 10 2011 075 352

(51) Int. Cl.
*H01L 31/042* (2014.01)
*H01L 31/0224* (2006.01)
*H01L 21/268* (2006.01)
*H01L 31/05* (2014.01)

(52) U.S. Cl.
CPC ...... *H01L 31/022441* (2013.01); *H01L 21/268* (2013.01); *H01L 31/0516* (2013.01); *Y02E 10/50* (2013.01)

(58) Field of Classification Search
CPC ........ H01L 31/00–31/078; Y02E 10/50–10/60
USPC .................................. 136/243–265
See application file for complete search history.

(56) References Cited

U.S. PATENT DOCUMENTS

| | | | |
|---|---|---|---|
| 4,703,553 A | 11/1987 | Mardesich | |
| 2002/0084503 A1 | 7/2002 | Lee et al. | |
| 2006/0231802 A1* | 10/2006 | Konno | 252/500 |
| 2010/0275965 A1* | 11/2010 | Lee et al. | 136/244 |
| 2010/0319770 A1* | 12/2010 | Lee et al. | 136/256 |
| 2011/0011440 A1* | 1/2011 | Hioki et al. | 136/244 |

FOREIGN PATENT DOCUMENTS

| | | |
|---|---|---|
| DE | 19508712 C2 | 9/1996 |
| EP | 2003699 A2 | 12/2008 |
| EP | 2031659 A1 | 3/2009 |

OTHER PUBLICATIONS

EP Examination Report Dated Apr. 18, 2012, issued in co-pending German Patent Application No. DE 10 2011 075 352.4, 12 pages.
Chinese Office Action, Application No. 201210138673.4, dated Mar. 13, 2015, 10 pages.
English translation of Chinese Office Action, Application No. 201210138673.4, dated Mar. 13, 2015, 9 pages.

* cited by examiner

*Primary Examiner* — Bach Dinh
(74) *Attorney, Agent, or Firm* — Barley Snyder

(57) ABSTRACT

For contacting a silicon solar cell a pre-processed silicon substrate with a frontside and a backside is provided. Then, aluminum is deposited on the backside of the pre-processed silicon substrate, wherein aluminum-free regions remain on the backside. Then, a silver-free layer suitable for soldering on the backside of the silicon substrate is deposited so that the silver-free layer suitable for soldering covers at least the aluminum-free regions on the backside.

12 Claims, 9 Drawing Sheets

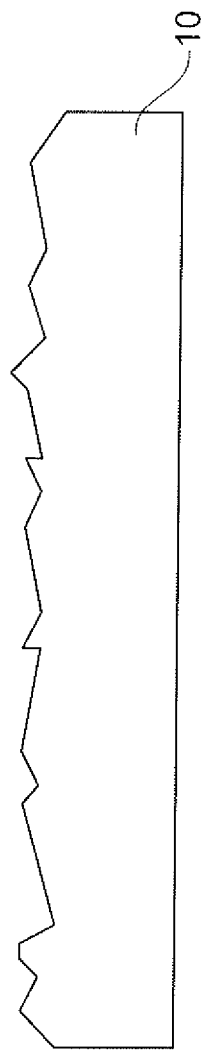
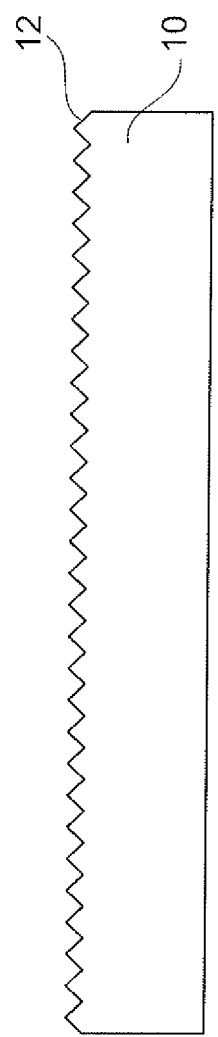

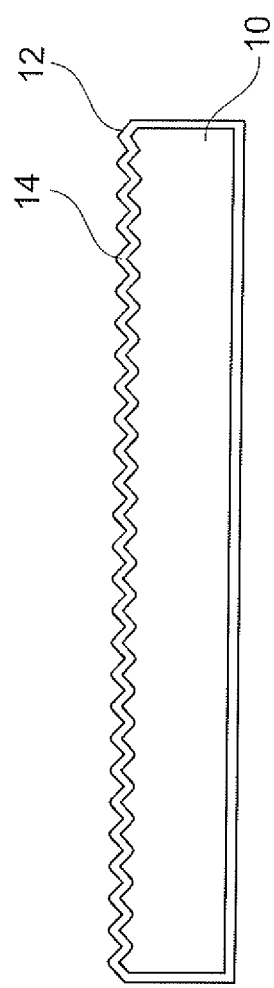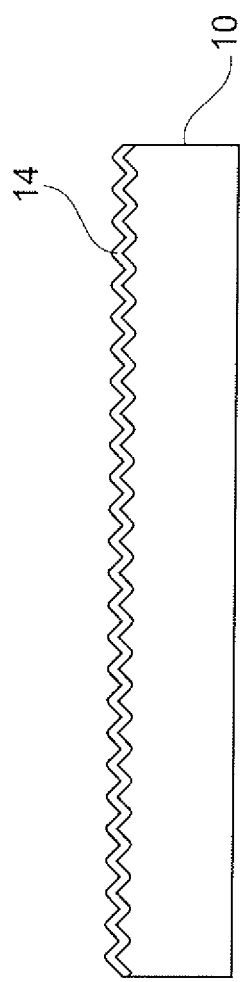
Fig. 3
Fig. 4

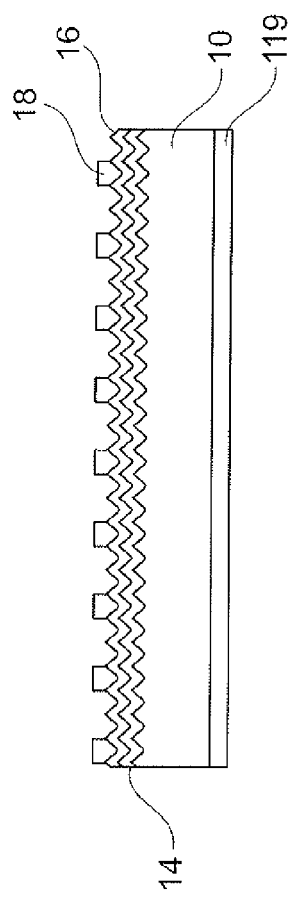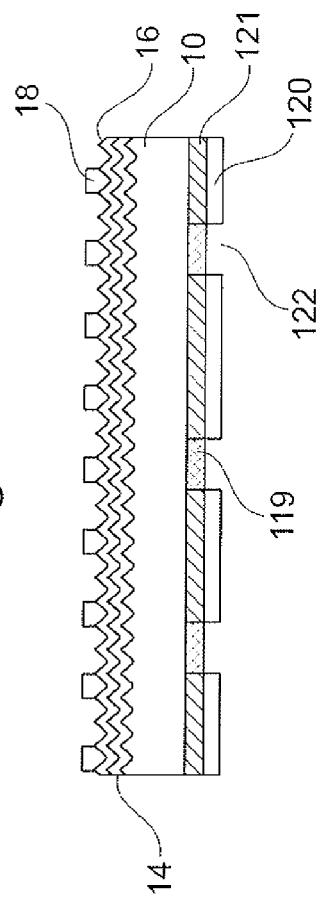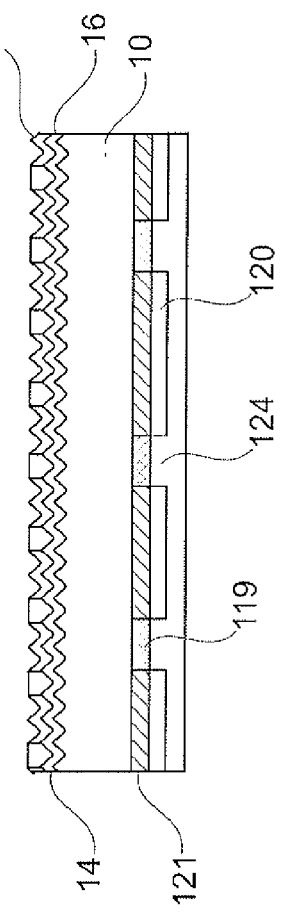

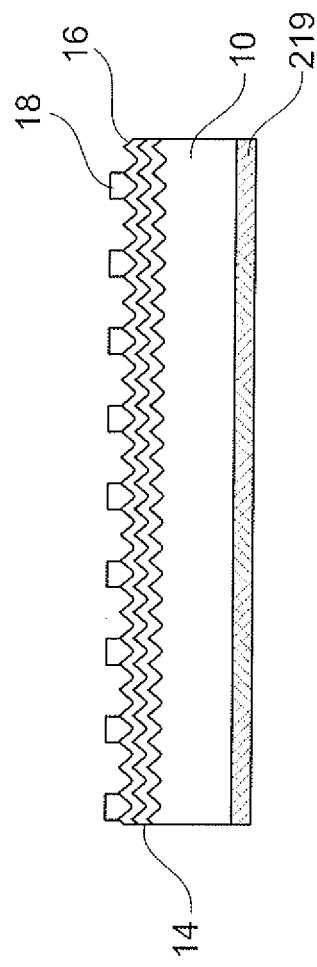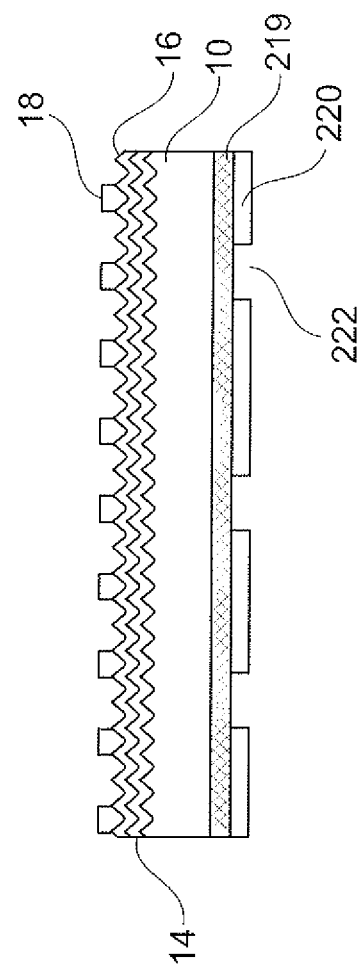

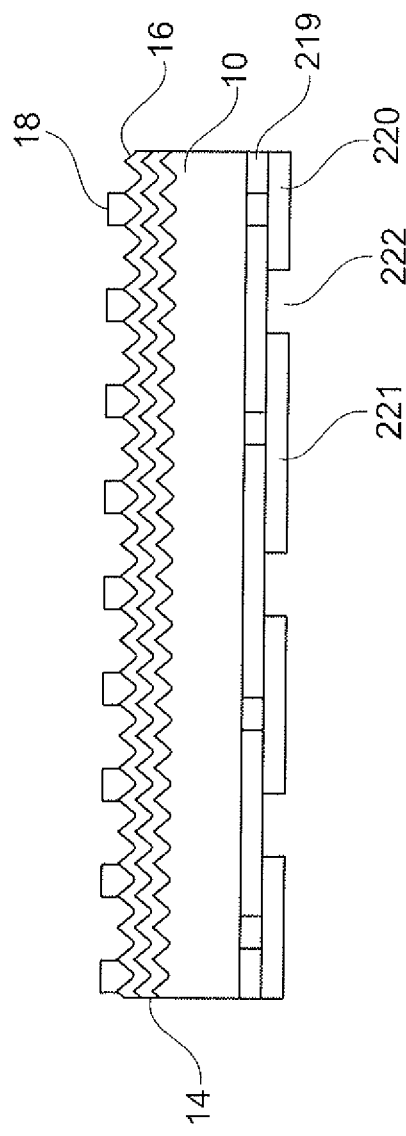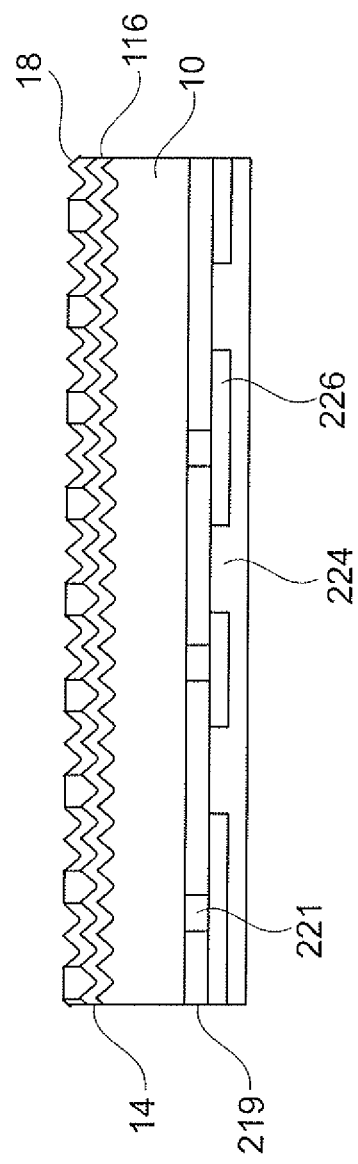

METHOD FOR BACKSIDE-CONTACTING A SILICON SOLAR CELL, SILICON SOLAR CELL AND SILICON SOLAR MODULE

CROSS-REFERENCE TO RELATED APPLICATIONS

This application claims the benefit of the filing date under 35 U.S.C. §119(a)-(d) of German Patent Application No. DE 10 2011 075 352.4, filed May 5, 2011.

FIELD

The present invention relates to a method for backside-contacting a silicon solar cell, to a silicon solar cell and to a silicon solar module.

BACKGROUND

Typically, silicon is used as a basic material for solar cells. The starting point in the manufacture of a silicon solar cell is a crystalline silicon wafer in which a p-n junction is formed by means of doping. The procedure thereby is usually such that a p-doped silicon base material is used and an n-doped emitter layer is formed in order to configure the p-n junction. Both terminals of the p-n junction are then typically contacted via the frontside and backside of the silicon wafer.

Within the framework of backside contacting, what is referred to as a "back-surface field" is configured on the silicon wafer backside in order to prevent recombination losses. For this purpose, an aluminum layer is typically deposited on the silicon wafer backside, covering the entire surface, the aluminum layer then being subjected to a sintering process in order to superficially fuse the aluminum layer at the boundary surface with the silicon wafer and to alloy the aluminum into the silicon wafer. During operation of the solar cell, the resulting highly p-doped silicon surface layer acts as a back-surface field which drives the minority current carriers which reach the backside by means of diffusion back into the silicon wafer, thus preventing recombination losses.

In order to save costs, the introduction of aluminum into the silicon wafer is preferably carried out by means of a screen-printing process in which an aluminum paste is deposited on the silicon wafer backside and cured into the silicon wafer at 700 to 900° C. after drying in order to configure the back-surface field.

The problem with the screen-printed sintered aluminum layer on the silicon wafer backside, however, is that it is only to a very limited extent suitable for soldering contact connectors in order to connect the solar cell, particularly solder wires. In order to achieve a technically useable capacity in solar cells, a plurality of solar cells is usually connected in series to form a solar module. In the series connection of the solar cells, the frontside contacts of a solar cell are soldered to the backside contacts of the next solar cell by means of the contact connectors, i.e. typically solder wires, in order to form what is known as a string of cells.

Such a soldering connection between the screen-printed sintered aluminum layer and the contact connector is, however, extremely unstable, predominantly due to the high probability of cohesive failure of the aluminum layer. For contacting the silicon wafer backside, aluminum-free contact regions are usually provided on the silicon wafer backside. These contact regions comprising a width of several millimeters are provided with a silver-containing screen-printed metallization layer to which the contact connectors may be soldered.

The silver screen-print is in this context usually carried out prior to the aluminum screen-print, with the two screen-print surfaces overlapping slightly.

However, since silver is a relatively expensive resource, it would be desirable for such additional silver contacts to become redundant. As an alternative for backside contacts made of silver, EP 2 003 699 A2 suggests to deposit a screen-printed aluminum layer over the entire surface of the silicon wafer backside and to subsequently cure it in order to form a back-surface field at the boundary surface. Subsequently, a further layer of material suitable for soldering, preferably tin, is deposited over the entire surface or in partial regions of the screen-printed sintered aluminum layer. This second layer is alloyed into the aluminum layer beneath in a point-wise manner by means of acoustic-mechanical irradiation, superficial fusing or thermal spraying, resulting in conductive contact regions to which contact connectors, particularly solder wires, may be soldered. Ultrasonic loading as well as superficial fusing or, respectively, thermal spraying, however, confers high kinetic energy to the solder particles to be alloyed, which may result in damage to the silicon wafer surface and thus in a deterioration of electrical properties of the solar cell. For alloying the material suitable for soldering into the screen-printed sintered aluminum layer, only a very small process latitude is thus available which is to be precisely observed in order to prevent the danger of negatively influencing the electrical solar cell parameters.

SUMMARY

The present invention generally relates to an improved method for backside-contacting a silicon solar cell, to an improved silicon solar cell and an improved silicon solar module.

One embodiment of the invention provides a method for contacting a silicon solar cell. The method comprising providing a pre-processed silicon substrate with a frontside and a backside, depositing aluminum on the backside of the pre-processed silicon substrate, wherein aluminum-free regions remain on the backside, and depositing a silver-free layer suitable for soldering on the backside of the silicon substrate so that the silver-free layer suitable for soldering covers at least the aluminum-free regions on the backside.

Another embodiment of the invention provides a silicon solar cell having at least one contacting. The silicon solar cell comprises a pre-processed silicon substrate having a frontside and a backside, an aluminum layer on the backside of the pre-processed silicon substrate comprising aluminum-free regions arranged in the form of arrays, and a silver-free layer suitable for soldering, the silver-free layer suitable for soldering covering at least the aluminum-free regions on the backside.

Yet another embodiment of the invention provides a silicon solar cell comprising a pre-processed silicon substrate having a frontside and a backside and contact regions for connecting to further solar cells, at least one first contact region for forming an electrical connection on the backside of the pre-processed silicon substrate, the first contact region comprising a silver-free layer suitable for soldering on an aluminum layer, and at least a second contact region for forming a mechanical connection on the backside of the pre-processed silicon substrate, the second contact region comprising a silver-free layer suitable for soldering in an aluminum-free region of the silicon substrate.

Yet another embodiment of the invention provides a silicon solar module comprising at least a first and a second silicon solar cell, the silicon solar cells being connected in series, wherein a frontside contacting of the first silicon solar cell is connected to the backside contacting of the second silicon solar cell by at least one contact connector, the contact connector being respectively soldered to a layer suitable for soldering in the region of at least one aluminum-fee region on the backside surface of the silicon solar cell body.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1 to 8 depict a first method for manufacturing a silicon solar cell having a backside contacting, the figures showing schematic cross-sections through the silicon solar cell body after subsequent process steps.

FIGS. 11 to 13 illustrate a second method for manufacturing a silicon solar cell having a backside contacting, the figures each showing schematic cross-sections through the silicon solar cell body after subsequent process steps.

FIGS. 14 to 17 depict a third method for manufacturing a silicon solar cell having a backside contacting, the figures each showing schematic cross-sections through the silicon solar cell body after subsequent process steps.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Figure 9:
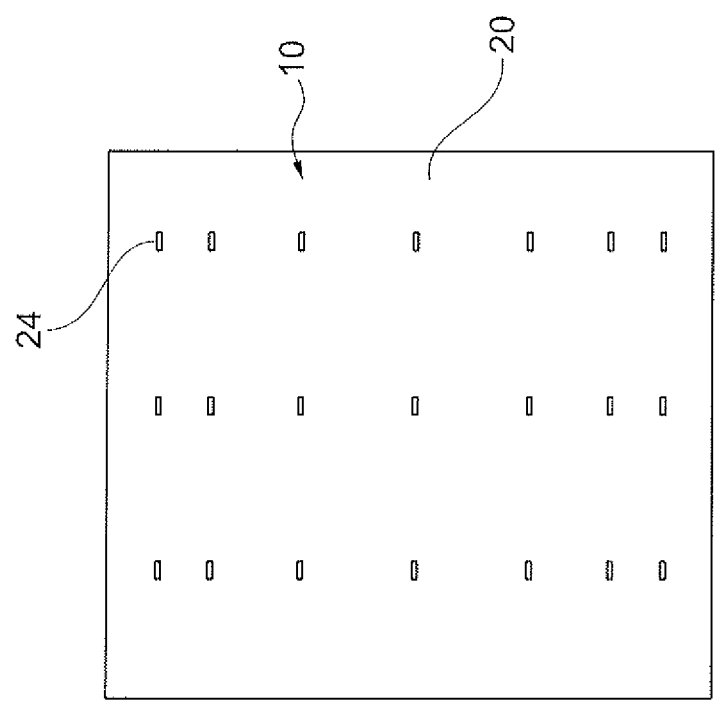
FIG. 9 shows the backside of the silicon cell comprising the backside contacting which has been manufactured by means of the method depicted in FIGS. 1 to 8.
Figure 10:
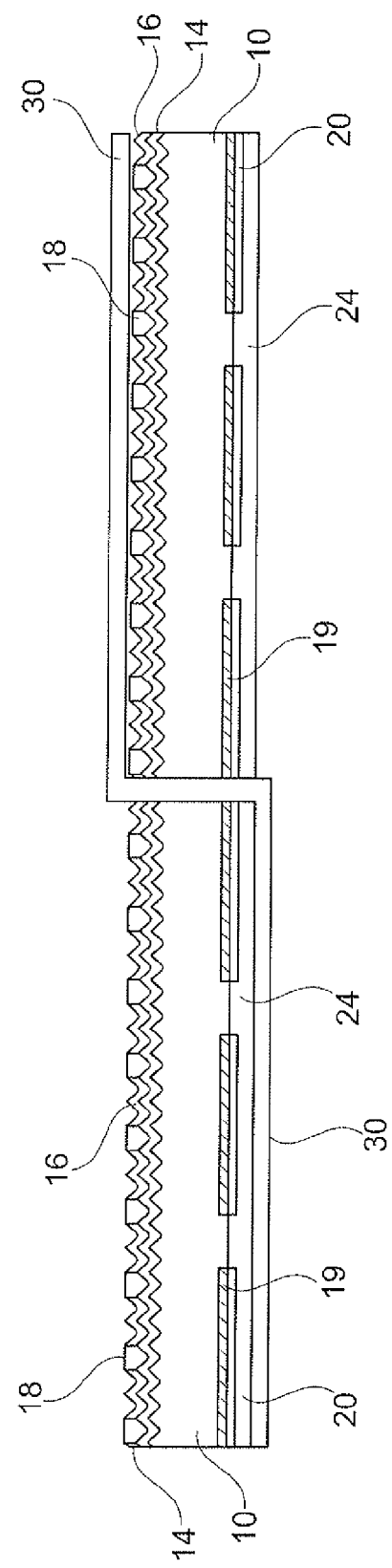
FIG. 10 depicts a cross-section through a solar module comprising two silicon solar cells connected in series.

In the following, a possible configuration of a method for manufacturing a silicon solar cell provided with a backside-contacting comprising a back-surface field in an inexpensive and simple manner, is explained in conjunction with schematic FIGS. 1 to 8. FIG. 9 shows a rear view of the silicon solar cell with a possible configuration of the contact fields for backside-contacting. FIG. 10 shows a section of a solar cell module with two solar cells connected in series. FIGS. 11 to 13 and 14 to 17 each show a further possible configuration of the method for manufacturing a silicon solar cell having an inexpensive and easily configurable backside-contacting comprising a back-surface field. All Figures are merely schematic depictions and are not drawn to scale.

In the method for configuring a backside-contacting on a silicon solar cell according to the invention, known processes from the field of semiconductor and solar technology are used. Moreover, materials common in semiconductor and solar technology are used. It is further to be noted that the depicted solar cell or, respectively, the solar module may comprise further structures and structural elements than those shown. In the same manner, further method steps apart from those described may be carried out during manufacture in order to complete the production of the solar cell or, respectively, the solar module.

The starting point when manufacturing the solar cell is a silicon wafer 10. In order to manufacture the silicon wafer, highly purified silicon is melted and subsequently solidified. Depending on the crystallization process, either monocrystalline silicon having one crystal orientation or polycrystalline silicon having various crystal orientations is generated. The silicon comprises a basic doping, particularly a p-type basic doping such as boron, which is introduced within the framework of the melting and solidification process. The monocrystalline or, respectively, polycrystalline silicon which is in the shape of a block or, respectively, of a rod is preferably cut into square discs which are also referred to as wafers by means of a wire-sawing process. The discs typically have an edge length of 100 to 210 mm and a thickness of 100 to 300 μm.

FIG. 1 shows a cross-sectional view of a sawed silicon wafer 10 with sawing damage on the surface. In order to remove the sawing damage, the silicon wafer is superficially etched, additionally generating a surface structure 12. When using a suitable etching solution which is particularly adapted to either monocrystalline or polycrystalline silicon, a stochastic surface structure is produced on the silicon wafers, e.g. in the shape of pyramids, as shown in the cross-section of FIG. 2. Due to the surface structure 12 on the silicon solar cell body 10, absorption losses during light radiation may be reduced.

After the etching process, a p-n junction 14 is formed in the silicon wafer 10. For this purpose, n-dopants are introduced into the surface region of a silicon solar cell body 10 pre-doped with p-dopants. In order to n-dope the silicon wafer, phosphorus is preferably diffused into the silicon wafer up to a depth of 0.5 to 1 μm. In order to introduce phosphorus, the silicon wafer is e.g. subjected to a phosphorous ambience at a high temperature. Contrary to the p-doped silicon base material, the highly n-doped silicon layer is negatively conductive and acts as an n-emitter. During operation, the p-n junction 14 formed in the silicon solar cell body provides the separation of the charge carriers generated by light radiation.

When forming the p-n junction 14, the silicon is typically doped all over with phosphorus, as shown in the cross-section of FIG. 3. In order to prevent a short circuit within the solar cell, the phosphorus doping is etched off at the edges and at the backside. FIG. 4 depicts the resulting silicon wafer 10 with the n-emitting layer 14 on the frontside.

Figure 5:
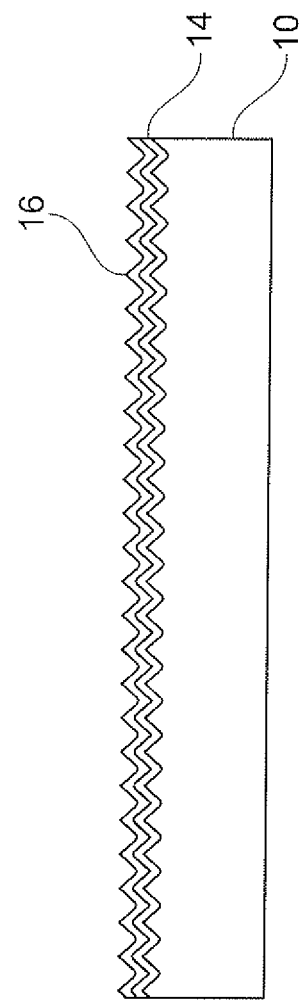

In a next step, an antireflective layer 16, usually silicon-nitride, is deposited on the silicon emitter layer 14, the thickness of the layer amounting to approximately 80 nm. FIG. 5 depicts the silicon wafer 10 after deposition of the antireflection layer 16.

Figure 6:
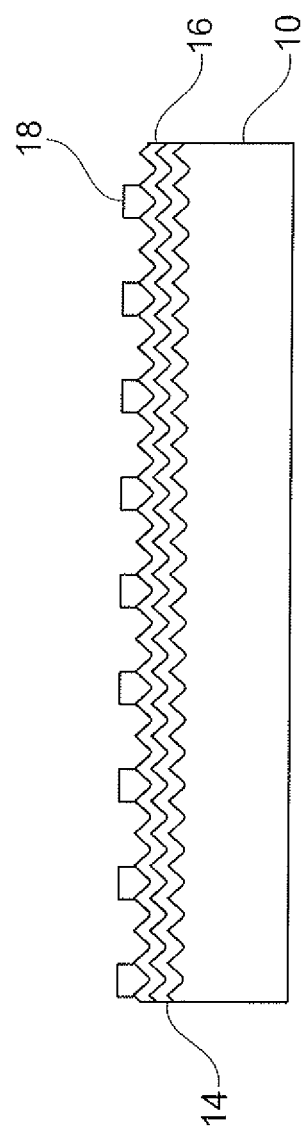

After annealing the silicon wafer surface by means of the antireflective layer 16, the contacting of the junction 14 in the silicon solar cell body 10 is carried out. Here, frontside contacts 18 are typically formed first. The frontside contacts are preferably configured in the shape of fingers in order to keep the shadowing effects caused by the contact pads as low as possible. The frontside contacts 18, for which silver is typically used, are usually deposited by means of a screen-printing process. FIG. 6 shows a cross-sectional view of the silicon wafer 10 after depositing the frontside contacting in the shape of silver contact fingers 18.

Figure 7:
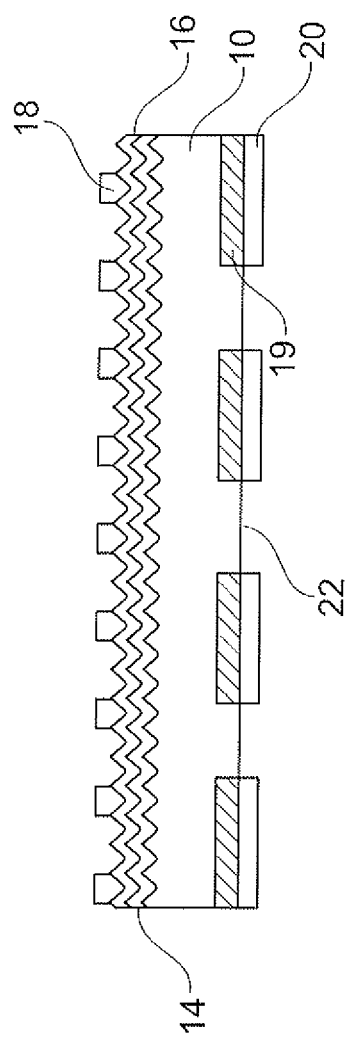

Subsequently, the backside contacting of the silicon wafer is carried out. For this purpose, an aluminum paste is deposited on the backside of the silicon solar cell body by means of screen-printing, thus forming a layer thickness of 10 to 100 μm. Printing is thereby preferably carried out by means of a scraper which pushes an aluminum paste over a stencil. In the stencil, fields which preferably have a line-like extension are thereby covered. The width of the fields is less than 1 mm, preferably less than 0.5 mm. The length of the fields amounts to 1 to 3 mm, preferably 2 mm. The fields are preferably arranged in rows, wherein in a standard solar cell size of 15.6×15.6 cm e.g. three rows of longitudinally oriented fields are configured with seven fields in each row. When depositing the screen-printed aluminum layer 20, a regular arrangement of aluminum-free fields 22 is thus produced on the backside of the silicon solar cell body. FIG. 7 shows a cross-section through the silicon wafer 10 after the screen-printed aluminum layer 20 has been carried out comprising three aluminum-free rows of fields 22.

Subsequently, the silicon wafer is heated in a continuous furnace at a maximum temperature of 700 to 900° C. for 1 to 30 sec. By means of this sintering process, an aluminum-doped layer is formed in the surface region of the silicon wafer which is highly p-conductive and acts as a back-surface field during operation of the solar cell, the back-surface field driving back the minority current carriers into the silicon solar cell body and thus reducing recombination losses on the solar cell backside.

In a next step, a silver-free material suitable for soldering is deposited on the screen-printed sintered aluminum layer 20 in a non-contacting manner. In this context, nickel-vanadium, nickel, copper, tin or zinc are preferably used as a silver-free material suitable for soldering, nickel-vanadium with a 5% vanadium content being particularly used. The silver-free material suitable for soldering is thereby deposited in such a way that at least the aluminum-free fields 22 on the backside surface of the silicon solar cell body are covered. The silver-free material suitable for soldering may, however, also be deposited over the entire surface, thus additionally covering the whole screen-printed aluminum layer 20. The thickness of the layer of silver-free material suitable for soldering is in this context 10 to 100 nm, whereby the aluminum-free fields 22 on the silicon wafer backside are filled.

In order to deposit the silver-free material suitable for soldering in a non-contacting manner, a sputtering process is used; however, it is also possible to use a CVD process, galvanic deposition, plasma spraying or thermal spraying for depositing the silver-free layer suitable for soldering in a non-contacting manner.

Figure 8:
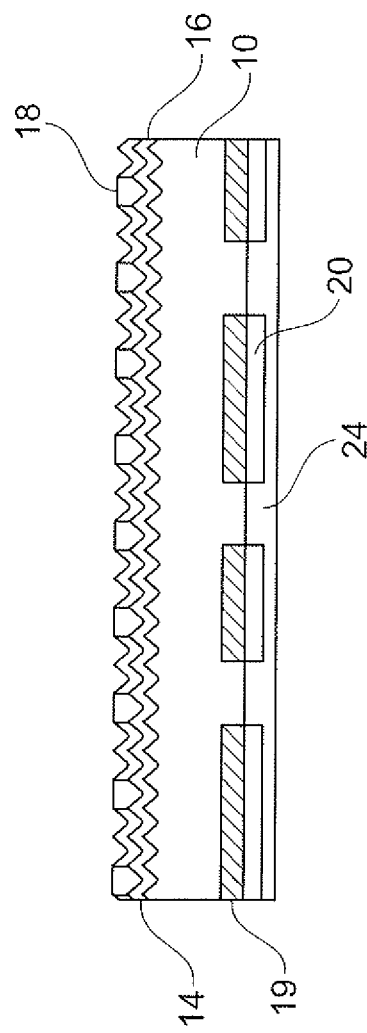

FIG. 8 is a cross-sectional view of the silicon wafer 10 after depositing the silver-free layer 24 suitable for soldering, the figure showing an embodiment in which only the aluminum-free fields are filled. FIG. 9 shows a corresponding top view onto the backside of the silicon solar cell body 10 in which three rows of fields 24 are each configured with seven fields in a row, these fields being filled with silver-free material suitable for soldering.

By using a silver-free material suitable for soldering, material costs may be saved when compared to the use of silver contacts. Moreover, the procedure of first depositing the aluminum layer in a screen-print and then sintering it and only thereafter depositing the silver-free material suitable for soldering as a thin layer in a non-contacting manner, allows for reducing the size of the contact fields to a minimum, e.g. to a field size of 2 mm×0.5 mm, thus achieving a large-area aluminum covering, so that a back-surface field essentially extending over the entire silicon solar cell backside may be formed which minimizes recombination losses.

By depositing the silver-free material suitable for soldering in the form of a layer which is a thin film when compared to the aluminum layer, it is possible to deposit the layer over the entire surface or only covering the aluminum-free regions and then to arrange the contact connectors—particularly solder wires made of copper—required for connecting the backside in such a way that they extend across the fields in an essentially continuous manner. Said contact connectors may then be rigidly connected in a mechanical manner by means of soldering in the region of the fields containing the silver-free material suitable for soldering, the electrical contact then being effected via the contact fields as well as via the screen-printed sintered aluminum layer, over which the contact connectors extend. In this way, it is possible to decouple the mechanical connection of the contacts from the electrical connection, thus allowing for any desired configuration of the backside contacts, particularly in order to be able to optimally connect the silicon solar cells in the solar module.

When manufacturing solar modules, the solar cells are usually connected in series due to their low individual voltage, the frontside contacts of a solar cell being electrically connected to the backside contacts of the next solar cell by means of the contact connectors. A cell string comprising two solar cells 10 connected in series by means of a copper wire 30 is shown in FIG. 10. The inventive configuration of the backside contacting allows for a contacting having a good electrical conductivity and being resistant to mechanical stress. Instead of the contact configuration depicted in FIG. 10, any desired contact configuration is conceivable whereby the connection of the contact connectors on the backside of the solar cell takes place by soldering to the aluminum-free fields covered with silver-free material suitable for soldering.

FIGS. 11 to 13 schematically show a further embodiment according to the invention for forming a backside contacting on a silicon solar cell; in the following, only the process steps which are different from the method shown in FIGS. 1 to 8 will be explained. For this reason, FIGS. 11 to 13 use the same reference numerals for identical layers.

The processing of the silicon solar cell body depicted in FIGS. 1 to 6 is thereby used in the same manner for the second method. In this case, the silicon solar cell body 10 comprises an antireflective layer 16 on its frontside, on which a frontside contacting is in turn configured in the shape of silver contact fingers 18. Prior to carrying out the backside contacting, a dielectric layer 119 having a thickness of preferably 10 to 100 nm is deposited on the backside of the silicon solar cell body 10. Thereby, the dielectric layer 119 preferably consists of silicon nitride, silicon oxide, silicon carbide, amorphous silicon or aluminum oxide or of a combination of these compounds. The dielectric layer 119 provides a high-quality surface finish and reduces recombination losses on the silicon wafer backside. FIG. 11 shows a cross-section of the silicon solar cell body after depositing the dielectric layer 119.

In analogy to the procedure depicted in FIG. 7, a screen-printed aluminum layer 120 is then formed having a layer thickness of 10 to 100 nm. Printing is thereby preferably carried out by means of a scraper which pushes an aluminum paste over the stencil in order to deposit the aluminum paste on the backside of the silicon solar cell body. The stencil comprises fields, preferably with a line-like extension, the width of which is less than 1 mm and preferably about 0.05 mm. The length of the fields is 1 to 3 nm, preferably 2 nm. The fields are preferably connected in series, thus resulting in a regular arrangement of aluminum-free fields 122 on the backside of the silicon solar cell body. FIG. 11 depicts a cross-section of the silicon wafer with a screen-printed aluminum layer 120 which comprises three silicon-free rows of fields 122.

In a next step, aluminum is diffused from the screen-printed aluminum layer 120 through the dielectric layer 119 into the surface region of the silicon substrate 10. For this purpose, the silicon solar cell body is preferably heated in a continuous furnace to a temperature of 700 to 900° C. for 1 to 30 sec. The resulting sintering process generates aluminum-doped regions 121 in the dielectric layer 119 and the silicon substrate 10 beneath. Aluminum-free sections of the dielectric layer 119 remain beneath the aluminum-free regions 122 on the backside of the silicon solar cell body between the aluminum-doped regions 121. FIG. 13 shows a cross-sectional view of the situation after this process step.

A silver-free material suitable for soldering is then deposited on the screen-printed sintered aluminum layer 120 in a non-contacting manner. Here, nickel-vanadium, nickel, copper, tin or zinc are preferably used as silver-free material suitable for soldering, whereby use is particularly made of nickel-vanadium with a 5% vanadium content. As depicted in the cross-sectional view of FIG. 13, the silver-free material suitable for soldering 124 is deposited in such a way that at least the aluminum-free fields 122 on the backside surface of the silicon solar cell body 10 are covered; however, it is preferred to effect deposition over the entire surface. The layer thickness of the silver-free material suitable for soldering is preferably 10 to 100 nm, the aluminum-free fields 122 on the silicon backside being covered. The deposition of the silicon-free layer suitable for soldering is in this context preferably carried out by means of sputtering, CVD, galvanic deposition, plasma spraying or thermal spraying. FIG. 13 depicts a cross-sectional view through a silicon solar cell body 10 after depositing the silver-free layer suitable for soldering 124. The top view, in turn, corresponds to the top view of the backside of the silicon solar cell body shown in FIG. 9.

The above-described embodiment allows for the generation of an improved back-surface field region by means of the additional dielectric layer 119 and thereby provides a further reduction of recombination losses.

FIGS. 14 to 17 show a further embodiment of the method of the invention for forming a backside contacting of a silicon solar cell. When forming the frontside contacting, the used procedure is analogue to the method depicted in conjunction with FIGS. 1 to 8. Similar to the second embodiment shown in conjunction with FIGS. 11 to 13, in the case of the third embodiment, as shown in the cross-section of FIG. 14, a dielectric layer 219 is deposited on the backside of the silicon solar cell body. The layer thickness is thereby between 10 and 100 nm, wherein silicon nitride, silicon oxide, silicon carbide, amorphous silicon or aluminum oxide or, respectively, a combination thereof are preferably used.

In the next process step, as depicted in FIG. 15, an aluminum layer 220 of 10 to 100 nm is deposited, again preferably by means of screen printing, whereby aluminum-free fields 222 remain. Contrary to the second embodiment shown in conjunction with FIGS. 11 to 13, however, not the entire screen-printed aluminum layer 220 is heated for contacting the silicon substrate, but the aluminum layer is superficially fused in a point-wise manner, e.g. by means of laser heating, in order to diffuse aluminum through the dielectric layer 219 into the silicon substrate 10. FIG. 16 depicts a cross-sectional view through the silicon solar cell body 10 comprising the dielectric layer 219 on the backside of the screen-printed aluminum layer 220, whereby the aluminum contact positions 221 protrude from the screen-printed aluminum layer and extend through the dielectric layer 219 into the silicon solar cell body 10.

In the finalizing process step for backside contacting, silver-free material suitable for soldering is deposited on the screen-printed sintered aluminum layer 220 in a non-contacting manner, the silver-free material suitable for soldering preferably covering the aluminum-free fields 222 on the silicon wafer backside with a thickness of 10 to 100 nm. The procedure as well as the choice of material for depositing the silver-free material suitable for soldering in a non-contacting manner thereby corresponds to the procedure shown in conjunction with FIGS. 1 to 8 or 11 to 13, respectively.

Due to the additional dielectric layer, the above-described embodiment allows for a high-quality surface finish on the backside of the silicon solar cell body and as a result for largely suppressing undesired minority carrier recombination, the point-wise deposition of aluminum providing a good contacting of the silicon solar cell body while simultaneously forming back-surface field regions.

Generally, the process of backside-contacting a silicon solar cell involves depositing aluminum on the backside surface of a pre-processed silicon solar cell body, with aluminum-free regions remaining on the backside surface. Subsequently, a silver-free layer suitable for soldering is deposited on the backside surface of the silicon solar cell body provided with aluminum in a non-contacting manner, with the silver-free layer suitable for soldering covering at least the aluminum-free regions on the backside surface.

In the case of the silicon solar cell, at least a first contact region for forming an electrical contact is configured on a silicon substrate, the first contact region comprising a silver-free layer suitable for soldering on a screen-printed aluminum layer, as well as a second contact region for forming a mechanical contact, the second contact region comprising a silver-free layer suitable for soldering in an aluminum-free region of the silicon substrate. The area of the first contact region is in this context preferably ten times larger than the area of the second contact region.

By making silver redundant as a backside contact material, the manufacturing costs of the solar cell may be reduced. Furthermore, the deposition of the silver-free material suitable for soldering on the aluminum screen-print layer in a non-contacting manner, preferably by sputtering, chemical vapor deposition, thermal spraying, plasma spraying or galvanic deposition prevents damage of the wafer surface and thus any impact on the electrical solar cell parameters. When depositing the silver-free material suitable for soldering in a non-contacting manner, there is, contrary to the screen-printing process, no mechanical stress on the surface, thus reducing the danger of a wafer fracture. Moreover, only a small kinetic energy is conferred to the particles to be deposited during non-contacting deposition, thus preventing damage to the solar cell surface.

Further, a dielectric layer may be deposited on the backside of the pre-processed silicon solar cell body beneath the aluminum, the dielectric layer consisting of silicon nitride, silicon oxide, silicon carbide, amorphous silicon or aluminum oxide or a combination of these compounds. By means of this additional dielectric layer it is possible to form an improved back-surface field at the boundary area of the silicon wafer and thus to suppress potential minority carrier recombination losses. For backside-contacting the silicon solar cell body, aluminum is then driven from the aluminum layer, which is preferably deposited by means of a screen-print, into the dielectric layer and through the dielectric layer into the silicon substrate located beneath, leaving aluminum-free regions in the aluminum layer. The aluminum layer may thereby be diffused into the silicon substrate across the entire surface, e.g. by heating the silicon solar cell body, or merely in a point-wise manner, e.g. by laser heating.

In this context, the silicon solar cell is configured in such a way that the aluminum-free regions formed as fields in a screen-printed aluminum layer have a thickness of 10 to 100 µm, the silver-free covering layer suitable for soldering having a thickness of 10 to 100 nm. By means of this configuration of the backside contacting, it is possible to reduce the size of the aluminum-free fields on the backside of the silicon solar cell body and thus to achieve an aluminum layer which is enlarged in comparison to conventional silicon contacts, as well as an enlarged back-surface field, which results in an improved passivation of the silicon solar cell. The silver-free layer suitable for soldering which is comparatively thin when compared to the screen-printed aluminum layer provides that contact connectors in the transitional region between the layer suitable for soldering and the screen-printed aluminum layer rest on the screen-printed aluminum layer smoothly and thus provide a good electrical contact.

Further, the aluminum-free regions on the backside of the silicon solar cell body which have been filled up with silver-free material suitable for soldering are configured in a line-like manner with a width of less than 1 mm, preferably less than 0.5 mm. This width is sufficient to form a rigid mechanical connection with contact connectors by means of which silicon solar cells are connected in series in the context of a silicon module. The electrical connection may additionally be carried out via the screen-printed sintered aluminum layer. The mechanical connection of the contact connectors to the solar cell backside may thus be decoupled from the electrical connection, thus allowing for a reduction of the size of the contact pad.

The aluminum-free regions covered with silver-free material suitable for soldering are preferably arranged in rows on the backside surface of the silicon solar cell body so that a contact connector may extend over a row of such arrays and be soldered thereto, thus achieving a good mechanical hold of the contact connector.

Nickel, vanadium, nickel-vanadium, copper, tin and zinc may be used as silver-free material suitable for soldering, providing a good soldered connection with contact connectors, particularly with copper wires.

Although the present invention has been depicted and described in detail by preferred embodiments, the invention is not limited to the disclosed embodiment examples and a person skilled in the art is able to derive variations without exceeding the scope of protection of the present invention.

What is claimed is:

1. A silicon solar cell having at least one contacting, comprising:
   a pre-processed silicon substrate having a frontside and a backside;
   an aluminum layer on the backside of the pre-processed silicon substrate comprising
      an outer surface, and
      aluminum-free regions arranged in the form of arrays; and
   a silver-free layer suitable for soldering, the silver-free layer suitable for soldering covering the aluminum-free regions and substantially covering the entire outer surface of the aluminum layer on the backside.

2. The silicon solar cell of claim 1, a dielectric layer being provided on the backside of the pre-processed silicon substrate beneath the aluminum layer, the dielectric layer comprising at least one of the subsequent compounds: silicon nitride, silicon oxide, silicon carbide, amorphous silicon, aluminum oxide.

3. The silicon solar cell of claim 1, wherein spot-like electrical connections between the aluminum layer and the pre-processed silicon substrate are provided.

4. The silicon solar cell of claim 1, wherein aluminum contact points between the aluminum layer and the pre-processed silicon substrate are provided.

5. The silicon solar cell of claim 1, the aluminum layer comprising a thickness of 10 to 100 µm and the silver-free layer suitable for soldering having a thickness of 10 to 100 nm.

6. The silicon solar cell of claim 1, the arrays of aluminum-free regions being arranged in rows.

7. The silicon solar cell of claim 1, the arrays of aluminum-free regions having a width of less than 1 mm.

8. The silicon solar cell of claim 1, the arrays of aluminum-free regions having a width of less than 0.5 mm.

9. The silicon solar cell of claim 1, the silver-free layer suitable for soldering consisting of any of nickel-vanadium, nickel, copper, tin and zinc.

10. A silicon solar cell comprising:
    a pre-processed silicon substrate having a frontside and a backside and contact regions for connecting to further solar cells;
    an aluminum layer positioned on the backside of the silicon substrate and having an outer surface;
    at least one first contact region for forming an electrical connection on the backside of the pre-processed silicon substrate, the first contact region comprising a silver-free layer suitable for soldering on the aluminum layer and substantially covering the entire outer surface of the aluminum layer, and
    at least a second contact region for forming a mechanical connection on the backside of the pre-processed silicon substrate, the second contact region comprising a silver-free layer suitable for soldering in an aluminum-free region of the silicon substrate.

11. The silicon solar cell of claim 10, the pre-processed silicon substrate comprising a dielectric layer beneath the aluminum layer.

12. The silicon solar cell of claim 11, the area of the first contact region being at least ten times larger than the area of the second contact region.

* * * * *